US012578366B2

(12) United States Patent
Tine

(10) Patent No.: US 12,578,366 B2
(45) Date of Patent: Mar. 17, 2026

(54) VARIABLE SPEED DOMESTIC APPLIANCE AND METHOD OF MANAGING POWER SUPPLIED TO THE SAME

(71) Applicant: Haier US Appliance Solutions, Inc., Wilmington, DE (US)

(72) Inventor: Cheikh Tine, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 162 days.

(21) Appl. No.: 18/489,507

(22) Filed: Oct. 18, 2023

(65) Prior Publication Data

US 2025/0130258 A1     Apr. 24, 2025

(51) Int. Cl.
   *G01R 19/165*     (2006.01)
   *F25B 49/02*     (2006.01)
   *H04W 4/38*     (2018.01)

(52) U.S. Cl.
   CPC ........ *G01R 19/1659* (2013.01); *F25B 49/022* (2013.01); *H04W 4/38* (2018.02); *F25B 2600/021* (2013.01)

(58) Field of Classification Search
   CPC .............. G01R 19/1659; F25B 49/022; F25B 2600/021; H04W 4/38
   See application file for complete search history.

(56) References Cited

U.S. PATENT DOCUMENTS

| | | | | |
|---|---|---|---|---|
| 4,015,182 | A * | 3/1977 | Erdman | .................. F23N 3/082 |
| | | | | 388/934 |
| 4,654,566 | A * | 3/1987 | Erdman | .................. H02P 6/182 |
| | | | | 318/599 |
| 5,078,318 | A * | 1/1992 | Kawai | ..................... F24H 15/38 |
| | | | | 62/229 |
| 6,691,524 | B2 * | 2/2004 | Brooke | ................. F25D 17/065 |
| | | | | 62/228.4 |
| 8,010,240 | B2 | 8/2011 | Mattiocco et al. | |
| 9,850,890 | B2 * | 12/2017 | Lim | ........................ F04B 49/06 |
| 11,689,011 | B2 | 6/2023 | Pursifull | |
| 11,689,118 | B2 | 6/2023 | Ibrahim et al. | |
| 2004/0075343 | A1 | 4/2004 | Wareham et al. | |

FOREIGN PATENT DOCUMENTS

CN        102538093 A     7/2012

* cited by examiner

*Primary Examiner* — Thienvu V Tran
*Assistant Examiner* — Muaamar Qahtan Al-Taweel
(74) *Attorney, Agent, or Firm* — Dority & Manning, P.A.

(57) ABSTRACT

A domestic appliance includes a heat pump including a compressor; a power inverter electrically connected with the heat pump; and a controller operably connected with the heat pump and the power inverter, wherein the controller is configured to perform an operation. The operation includes determining an instantaneous current input at the domestic appliance; receiving a signal from a remote terminal, the signal including a total current input at the remote terminal, the instantaneous current input being at least a portion of the total current input; comparing the total current input against a current input limit at the circuit breaker after receiving the signal; and adjusting a current input at the domestic appliance from the instantaneous current input according to the comparison of the total current input and the current input limit at the circuit breaker.

20 Claims, 5 Drawing Sheets

400

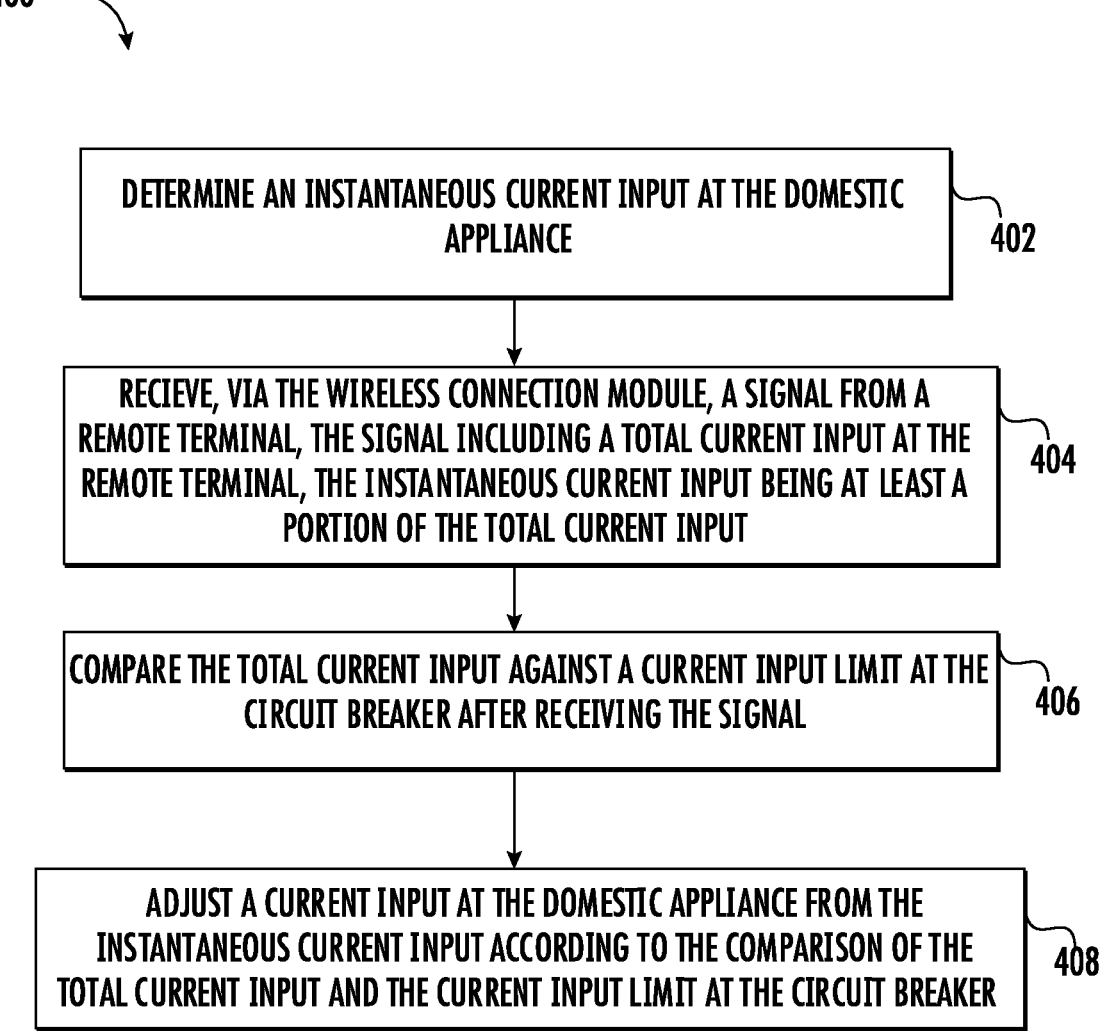

DETERMINE AN INSTANTANEOUS CURRENT INPUT AT THE DOMESTIC APPLIANCE    402

RECIEVE, VIA THE WIRELESS CONNECTION MODULE, A SIGNAL FROM A REMOTE TERMINAL, THE SIGNAL INCLUDING A TOTAL CURRENT INPUT AT THE REMOTE TERMINAL, THE INSTANTANEOUS CURRENT INPUT BEING AT LEAST A PORTION OF THE TOTAL CURRENT INPUT    404

COMPARE THE TOTAL CURRENT INPUT AGAINST A CURRENT INPUT LIMIT AT THE CIRCUIT BREAKER AFTER RECEIVING THE SIGNAL    406

ADJUST A CURRENT INPUT AT THE DOMESTIC APPLIANCE FROM THE INSTANTANEOUS CURRENT INPUT ACCORDING TO THE COMPARISON OF THE TOTAL CURRENT INPUT AND THE CURRENT INPUT LIMIT AT THE CIRCUIT BREAKER    408

FIG. 5

VARIABLE SPEED DOMESTIC APPLIANCE AND METHOD OF MANAGING POWER SUPPLIED TO THE SAME

FIELD OF THE INVENTION

The present subject matter relates generally to domestic appliances, and more particularly to home appliances including power inverters for adjusting a power draw of the appliance.

BACKGROUND OF THE INVENTION

Many common households include intricate electrical systems to manage electricity throughout the domicile. Multiple outlets may be included which are run through a central circuit breaker. Thus, several electrical outlets may be connected through one individual circuit breaker. Multiple devices may then be attached to each electrical outlet, resulting in a plurality of current draws through each circuit breaker. In many instances, each device is limited to a maximum current draw through the circuit breaker, regardless of a current draw of other devices also connected thereto.

Existing monitoring systems for circuit breakers with multiple devices attached have certain drawbacks. For instance, current monitoring only measures the current draw at each device connected. Additionally, only device with the ability to communicate with the monitoring system may provide relevant information thereto. Thus, further improvements are required to manage power output in current or voltage through circuit breakers having multiple devices attached thereto.

Accordingly, a domestic appliance that obviates one or more of the above-mentioned drawbacks would be beneficial. In particular, a method of monitoring and managing power input to a domestic appliance based on total current pull through a circuit breaker would be useful.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, a domestic appliance is provided. The domestic appliance may be electrically connected to a circuit breaker. The domestic appliance may include a heat pump, the heat pump including a compressor; a power inverter electrically connected with the heat pump; and a controller operably connected with the heat pump and the power inverter; the controller including a connection module configured to send and receive communication signals, wherein the controller is configured to perform an operation. The operation may include determining an instantaneous current input at the domestic appliance; receiving, via the connection module, a signal from a remote terminal, the signal including a total current input at the remote terminal, the instantaneous current input being at least a portion of the total current input; comparing the total current input against a current input limit at the circuit breaker after receiving the signal; and adjusting a current input at the domestic appliance from the instantaneous current input according to the comparison of the total current input and the current input limit at the circuit breaker.

In another exemplary aspect of the present disclosure, a method of operating a domestic appliance is provided. The domestic appliance may be electrically connected to a circuit breaker. The domestic appliance may include a heat pump including a compressor, a power inverter electrically connected with the heat pump, and a connection module configured to send and receive communication signals. The method may include determining an instantaneous current input at the domestic appliance; receiving, via the connection module, a signal from a remote terminal, the signal including a total current input at the remote terminal, the instantaneous current input being at least a portion of the total current input; comparing the total current input against a current input limit at the circuit breaker after receiving the signal; and adjusting a current input at the domestic appliance from the instantaneous current input according to the comparison of the total current input and the current input limit at the circuit breaker.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

FIG. 5 provides a flow chart illustrating a method of operating a domestic appliance according to exemplary embodiments of the present disclosure.

Figure 1:
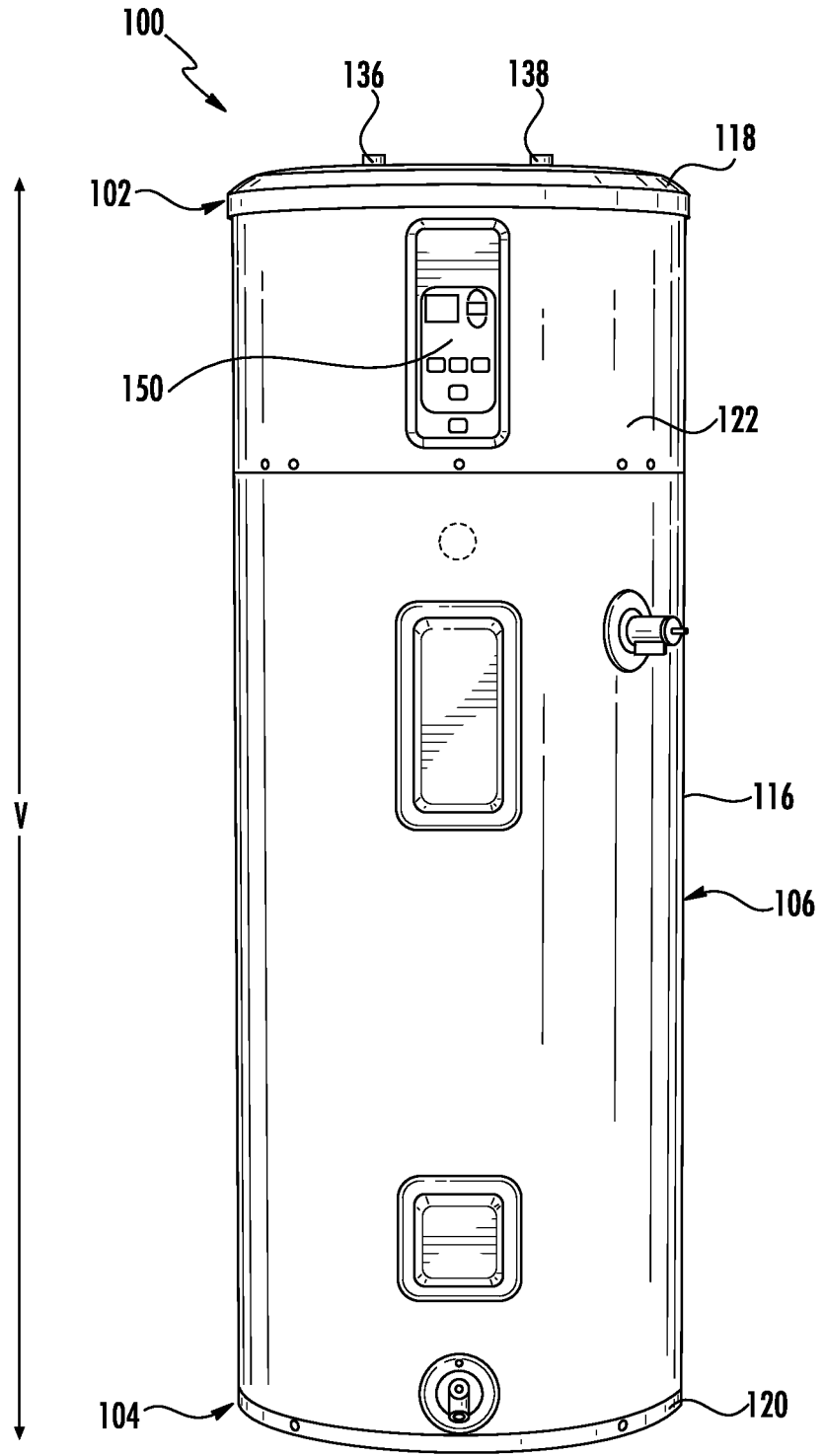
FIG. 1 provides a front elevation view of a water heater appliance according to an exemplary embodiment of the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first," "second," and "third" may be used interchangeably to distinguish one component from another and are not intended to signify location or importance of the individual components. The terms "includes" and "including" are intended to be inclusive in a manner similar to the term "comprising." Similarly, the term "or" is generally intended to be inclusive (i.e., "A or B" is intended to mean "A or B or both"). In addition, here and throughout the specification and claims, range limitations may be combined and/or interchanged. Such ranges are identified and include all the sub-ranges contained therein unless context or language indicates otherwise. For example, all ranges disclosed herein are inclusive of the endpoints, and the endpoints are independently combinable with each other. The singular forms "a," "an," and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "generally," "about," "approximately," and "substantially," are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin, i.e., including values within ten percent greater or less than the stated value. In this regard, for example, when used in the context of an angle or direction, such terms include within ten degrees greater or less than the stated angle or direction, e.g., "generally vertical" includes forming an angle of up to ten degrees in any direction, e.g., clockwise or counterclockwise, with the vertical direction V.

The word "exemplary" is used herein to mean "serving as an example, instance, or illustration." In addition, references to "an embodiment" or "one embodiment" does not necessarily refer to the same embodiment, although it may. Any implementation described herein as "exemplary" or "an embodiment" is not necessarily to be construed as preferred or advantageous over other implementations. Moreover, each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 provides a front elevation view of a water heater appliance 100 according to an exemplary embodiment of the present disclosure. The water heater appliance 100 defines a vertical direction V, and the water heater appliance 100 extends longitudinally between a top portion 102 and a bottom portion 104 along the vertical direction V. The water heater appliance 100 includes an outer shell or casing 106. The casing 106 generally surrounds a tank 108 (FIG. 2) such that the tank 108 is disposed within the casing 106. The tank 108 includes a top portion 110 and a bottom portion 112 spaced apart from one another along the vertical direction V. In addition, the tank defines an interior volume 114 extending between the top portion 110 and the bottom portion 112 along the vertical direction V.

Figure 3:
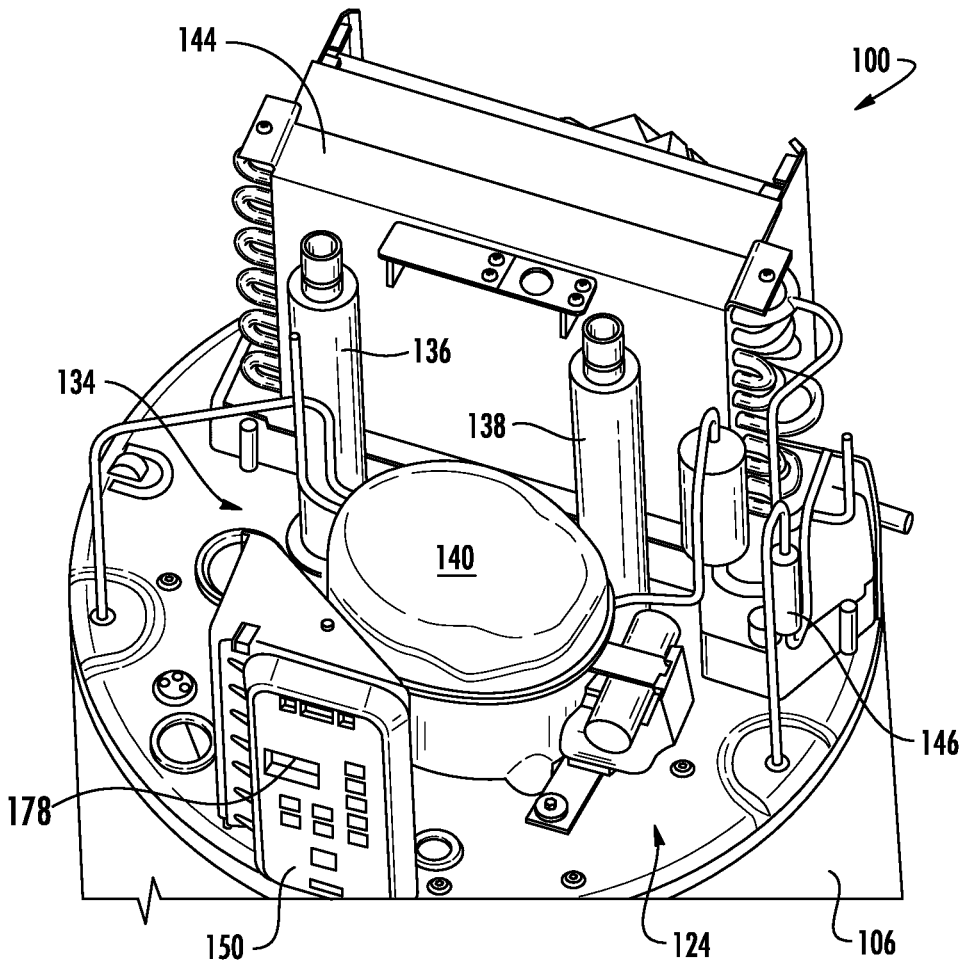
FIG. 3 provides a perspective view of a machinery compartment of the exemplary water heater appliance of FIG. 1, with a protective shroud and other components removed for clarity.

The casing 106 may be formed from a variety of components. As illustrated, the casing 106 may include a wrapper 116, one or more covers, such as a top cover 118 and a bottom cover 120, and a shroud 122 as illustrated. The shroud 122 may be positioned at the top portion 110 of the tank 108 along the vertical direction V such that the shroud 122 defines a chamber 124 (FIG. 3) positioned over the tank 108 along the vertical direction V. According to the illustrated embodiment, chamber 124 serves as a machinery compartment for housing various operating components of water heater appliance 100. Additionally, the shroud 122 may define a one or more vents or apertures (not shown) that extend through the shroud 122 from or to the chamber 124 of the shroud 122.

Upper and lower heating elements 130, 132 (FIG. 2) and a sealed system 134 (FIG. 2) may also be positioned within the casing 106 for heating water within the tank 108. The upper and lower heating elements 130, 132 can be any suitable heating elements. For example, the upper heating element 130 and/or lower heating element 132 may be an electric resistance element, a microwave element, an induction element, or any other suitable heating element or combination thereof. The lower heating element 132 may also be a gas burner. As will be understood by those skilled in the art and as used herein, the term "water" includes purified water and solutions or mixtures containing water and, e.g., elements (such as calcium, chlorine, and fluorine), salts, bacteria, nitrates, organics, and other chemical compounds or substances.

The water heater appliance 100 also includes an inlet or cold water conduit 136 and an outlet or hot water conduit 138 that are both in fluid communication with a chamber or interior volume 114 (FIG. 2) defined by the tank 108. As an example, cold water from a water source, e.g., a municipal water supply or a well, can enter the water heater appliance 100 through the cold water conduit 136. From the cold water conduit 136, such cold water can enter the interior volume 114 of the tank 108 wherein the water is heated with heating elements 130, 132 and/or sealed system 134 to generate heated water. Such heated water can exit the water heater appliance 100 at the hot water conduit 138 and, e.g., may be supplied to a bath, shower, sink, or any other suitable feature.

As mentioned above, the water heater appliance 100 extends longitudinally between the top portion 102 and the bottom portion 104 along the vertical direction V. Thus, the water heater appliance 100 is generally vertically oriented. The water heater appliance 100 can be leveled, e.g., such that the casing 106 is plumb in the vertical direction V, in order to facilitate proper operation of the water heater appliance 100. It should be understood that the water heater appliance 100 is provided by way of example only and that the present subject matter may be used with any suitable water heater appliance, including for example any heat pump water heater appliance.

Figure 2:
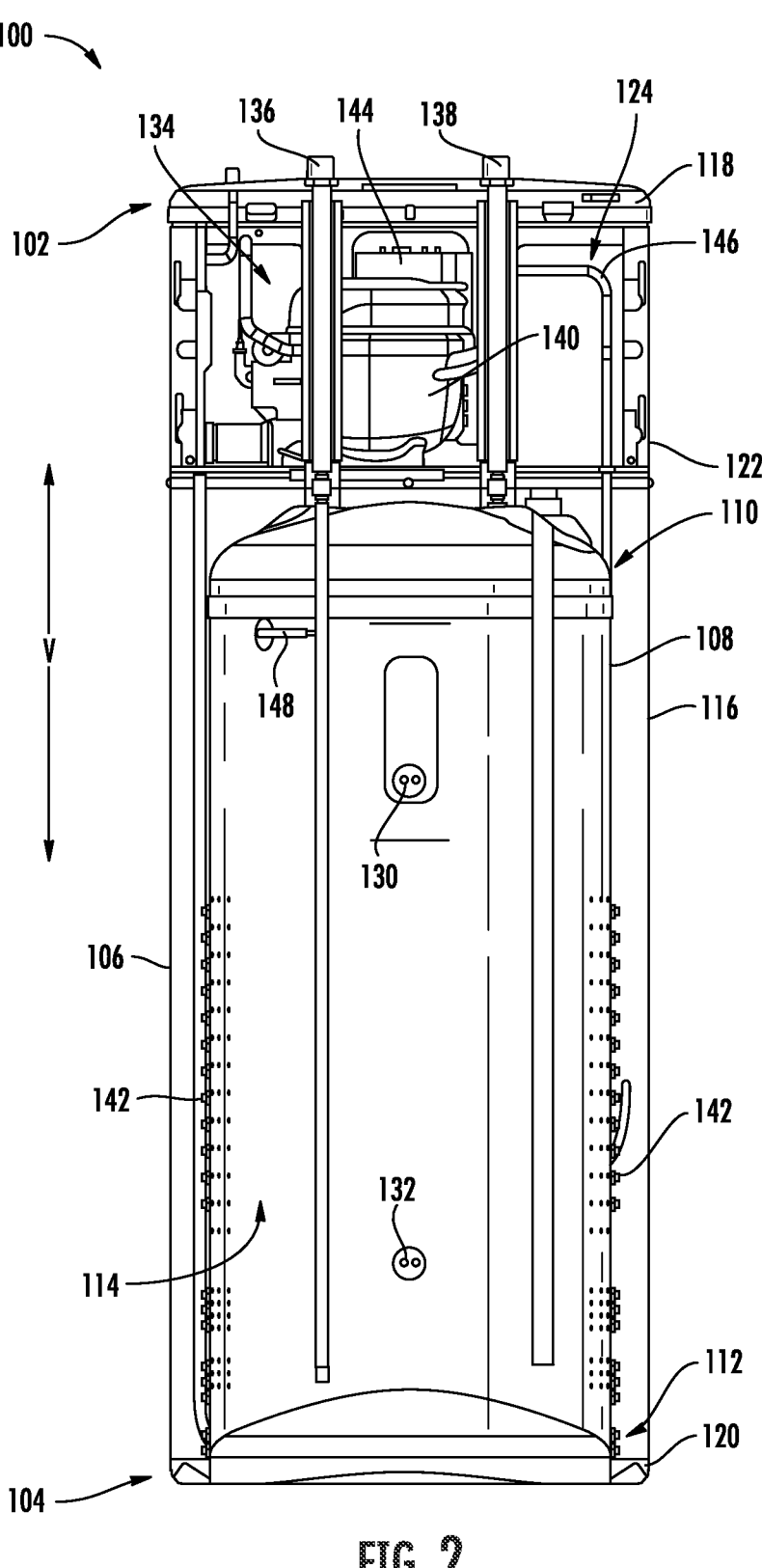
FIG. 2 provides a front section view of the exemplary water heater appliance of FIG. 1.

FIG. 2 provides a front section view of the water heater appliance 100. As may be seen in FIG. 2, the water heater appliance 100 includes the sealed system 134 for heating water within the interior volume 114 of the tank 108. The sealed system 134 generally operates in a heat pump cycle. Thus, the water heater appliance 100 is commonly referred to as a "heat pump water heater appliance." The water heater appliance 100 may additionally include one or more auxiliary heating elements, such as the upper heating element 130 and/or the lower heating element 132.

The sealed system 134 may include a compressor 140, a condenser 142 and an evaporator 144. The compressor 140 and/or evaporator 144 of the sealed system 134 may be disposed within the casing 106 at the top portion 102 of the water heater appliance 100, e.g., within the machinery compartment or shroud 122. As is generally understood, various conduits may be utilized to flow refrigerant between the various components of the sealed system 134. Thus, e.g., the evaporator 144 may be between and in fluid communication with the condenser 142 and the compressor 140. During operation of the sealed system 134, refrigerant may flow from the evaporator 144 through the compressor 140. For example, refrigerant may exit the evaporator 144 as a fluid in the form of a superheated vapor and/or high quality vapor mixture. Upon exiting the evaporator 144, the refrigerant may enter the compressor 140. The compressor 140 may be operable to compress the refrigerant. Accordingly, the pressure and temperature of the refrigerant may be increased in the compressor 140 such that the refrigerant becomes a superheated vapor.

The condenser 142 may be assembled in a heat exchange relationship with the tank 108 in order to heat water within the interior volume 114 of the tank 108 during operation of the sealed system 134. In particular, the condenser 142 may be positioned downstream of and in fluid communication with the compressor 140, and may be operable to heat the water within the interior volume 114 using energy from the refrigerant. For example, the superheated vapor from the compressor 140 may enter the condenser 142 wherein it transfers energy to the water within the tank 108 and condenses into a saturated liquid and/or liquid vapor mixture.

The sealed system 134 may also include a throttling device 146 between the condenser 142 and the evaporator 144. Refrigerant, which may be in the form of high quality/saturated liquid vapor mixture, may exit the condenser 142 and travel through the throttling device 146 before flowing through the evaporator 144. The throttling device 146 may generally expand the refrigerant, lowering the pressure and temperature thereof. The refrigerant may then be flowed through the evaporator 144.

The throttling device 146 may be any suitable components for generally expanding the refrigerant. For example, in some exemplary embodiments, the throttling device 146 may be a Joule-Thomson expansion valve, also known as a "J-T valve." In other exemplary embodiments, throttling device 146 may be an ejector. In still other exemplary embodiments, an electronic expansion valve, a capillary tube, a fixed orifice, or any other suitable apparatus may be utilized as throttling device 146.

The water heater appliance 100 may additionally include a temperature sensor 148. The temperature sensor 148 may be configured for measuring a temperature of water within the interior volume 114 of tank 108. The temperature sensor 148 can be positioned at any suitable location within the water heater appliance 100. For example, temperature sensor 148 may be positioned within the interior volume 114 of tank 108 or may be mounted to tank 108 outside of the interior volume 114 of tank 108. The temperature sensor 148 may further be positioned within an upper portion of tank 108. Alternatively, temperature sensor 148 may be positioned within a lower portion of tank 108. When mounted to tank 108 outside of the interior volume 114 of tank 108, temperature sensor 148 can be configured for indirectly measuring the temperature of water within the interior volume 114 of tank 108. For example, temperature sensor 148 can measure the temperature of tank 108 and correlate the temperature of tank 108 to the temperature of water within the interior volume 114 of tank 108. The temperature sensor 148 may be any suitable temperature sensor. For example, temperature sensor 148 may be a thermocouple or a thermistor.

The water heater appliance 100 may further include a controller 150 that regulates operation of the water heater appliance 100. The controller 150 may be, for example, in operative communication with sealed system 134 (such as compressor 140, and/or other components thereof), auxiliary heating elements, and/or temperature sensor 148. Thus, controller 150 can selectively activate sealed system 134 and/or auxiliary heating elements in order to heat water within interior volume 114 of tank 108.

The controller 150 includes memory and one or more processing devices such as microprocessors, CPUs or the like, such as general or special purpose microprocessors operable to execute programming instructions or micro-control code associated with operation of water heater appliance 100. The memory can represent random access memory such as DRAM, or read only memory such as ROM or FLASH. The processor executes programming instructions stored in the memory. The memory can be a separate component from the processor or can be included onboard within the processor. Alternatively, the controller 150 may be constructed without using a microprocessor, e.g., using a combination of discrete analog and/or digital logic circuitry (such as switches, amplifiers, integrators, comparators, flip-flops, AND gates, and the like) to perform control functionality instead of relying upon software.

During operation of water heater appliance 100, evaporator 144 is generally configured to absorb heat, e.g., to increase the temperature of the refrigerant. For instance, water heater appliance 100 may include one or more fans positioned adjacent to, for example, evaporator 144 or condenser 142. The one or more fans may be selectively operated to direct an airflow over components within chamber 124, for example (e.g., evaporator 144, condenser 142, etc.). According to some embodiments, each of the fans is a variable speed fan. Accordingly, the fans may be directed at one of a plurality of speeds to produce varying airflows.

According to exemplary embodiments, water heater appliance 100 may further include an inverter power supply 160 that is operably coupled to sealed system 134 to provide energy from a suitable energy source (such as an electrical outlet) to sealed system 134, e.g., compressor 140, condenser 142, evaporator 144, etc. Sealed system 134 may distribute the energy to each component therein. Sealed system 134 and/or inverter power supply 132 may include other suitable components, such as a capacitor that generally connects sealed system 134 and the power supply, such as via high voltage diode, to a chassis.

As would be appreciated by one having ordinary skill in the art, inverter power supply 132 generates various power levels, such as between 10% and 100% of the total power capacity. By contrast, with conventional non-inverter power supplies, the power or electric intensity is either 100% or 0%, and power levels are made using a timed duty cycle. Advantageously, at power levels less than 100%, inverter power supply 132 has much better power distribution and output control for elements within sealed system 134 and/or adjacent fans.

Figure 4:
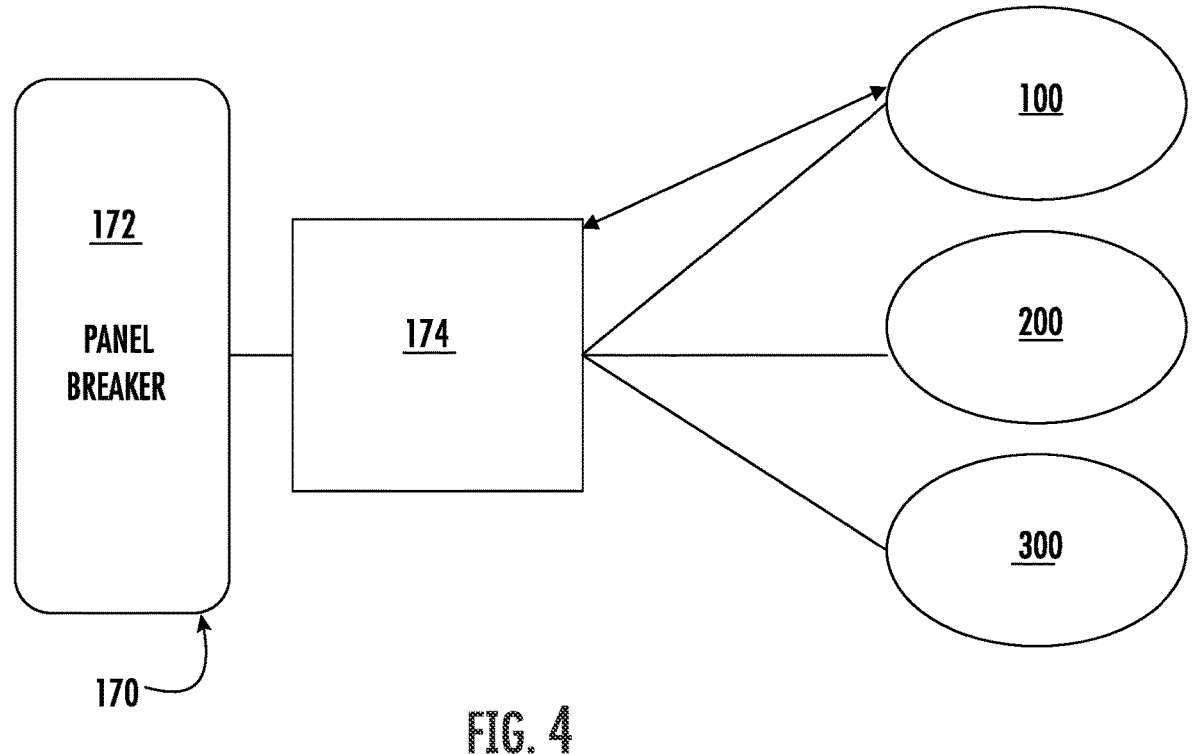
FIG. 4 provides a schematic diagram illustrating a system of appliances including the exemplary water heater appliance of FIG. 1 attached to a circuit breaker.

Referring now to FIG. 4, a circuit breaker including a plurality of devices connected thereto will be described according to an embodiment. A circuit breaker panel 170 may be provided, e.g., within a household or other domicile. A plurality of devices (e.g., including water heater appliance 100) may be electrically connected through circuit breaker panel 170. According to some examples, a single circuit breaker 172 provided within panel 170 may have multiple devices connected therethrough. Electricity (e.g., municipal electricity) may be supplied through circuit breaker 172 to each of the connected devices. The connected devices may include water heater appliance 100 among additional devices plugged into electrical outlets throughout the household. For instance, items such as hairdryers, coffee makers, electronics such as televisions and computers, refrigerator appliances, light fixtures, and the like (e.g., as represented by numerals 200, 300 in FIG. 4) may be connected through circuit breaker 170.

A current monitor 174 may be provided along the connection between the plurality of devices and circuit breaker 170. For instance, current monitor 174 may be positioned at or near circuit breaker 170. Each of the plurality of devices 100, 200, 300 may be electrically connected through current monitor 174. Current monitor 174 may include a smart current sense module capable of determining a current draw or pull from each of the plurality of devices 100, 200, 300. Accordingly, current monitor 174 may determine a distribution of power or electricity to each of the connected devices 100, 200, 300. For example, controller 150 may include a connection module 178 (FIG. 3) through which water heater appliance 100 communicates with current monitor 174. These communications may be facilitated using a wired or wireless connection, such as via a network. According to at least some embodiments, the communications are defined by a wired universal asynchronous receiver/transmitter (UART) protocol. Accordingly, signals may be sent back and forth between controller 150, current monitor 174, and water heater appliance 100.

Now that the general descriptions of an exemplary appliance have been described in detail, a method 400 of operating an appliance (e.g., water heater appliance 100) will be described in detail. Although the discussion below refers to the exemplary method 400 of operating water heater appliance 100, one skilled in the art will appreciate that the exemplary method 400 is applicable to any suitable domestic appliance capable of variable control through a power inverter. In exemplary embodiments, the various method steps as disclosed herein may be performed by controller 150 and/or a separate, dedicated controller. FIG. 5 provides a flow chart illustrating a method of operating a water heater appliance. Hereinafter, method 400 will be described with specific reference to FIG. 5.

At step 402, method 400 may include determining an instantaneous current input at a domestic appliance (e.g., water heater appliance 100). As described above, the domestic appliance may be electrically connected to a circuit breaker (e.g., circuit breaker 172) through a current monitor (e.g., current monitor 174). The domestic appliance may further be in communication (e.g., wired or wireless) with the current monitor. The current monitor may thus detect a current input (or draw) into the domestic appliance at one or more predetermined time stamps. The detected (or determined) instantaneous current draw may then be stored within an onboard memory of the domestic appliance (e.g., within the controller).

Step 402 may include sensing the instantaneous current draw or pull at a power inverter (e.g., inverter power supply 132). In detail, the appliance may be directed according to a predetermined setting. The predetermined setting may include a first set of operational or operating conditions. The first set of operational conditions may include a first compressor speed, a first fan speed, etc. For instance, a user may set a desired temperature for water supplied to the appliance. Thus, the appliance may retrieve (e.g., from a memory) the first set of operational conditions. The first set of operational conditions may be dependent on the circuit breaker to which the appliance is electrically connected. For instance, the circuit breaker may set a limit on individual current draw through connected devices. Thus, the first set of operational conditions may be based on the maximum current draw initially allocated through the circuit breaker.

At step 404, method 400 may include receiving a signal from a remote terminal. The signal may include a total current input at the remote terminal. For instance, the total current may include the instantaneous current determined at the domestic appliance. As mentioned above, a plurality of devices (e.g., devices 100, 200, 300) may be electrically connected through a single circuit breaker (e.g., via one or more electrical outlets within the building). Thus, in some embodiments, the signal includes an individual current draw from each connected device. The controller may receive each of the individual current draws and calculate a total current passing through the circuit breaker.

At step 406, method 400 may include comparing the total current input against a current input limit at the circuit breaker. For instance, after receiving the signal, method 400 may retrieve (or otherwise determine) the current input limit at the circuit breaker. The current input limit may be predetermined or predefined within the circuit breaker itself. Additionally or alternatively, the current input limit may be stored within the current sensing module or current monitor. For instance, the current sensing module may retrieve the current input limit from the circuit breaker (or breaker panel) and store the current input limit within an on board memory. The current input limit may be based on a type, style, or size of circuit breaker. For example, the current input limit may be about 15 Amps (A) for a common household circuit breaker.

In comparing the total current input (or draw) against the current input (or draw) limit, the method 400 may determine that the total current input or draw is greater than or less than a predetermined percentage of the current input or draw limit. According to at least some embodiments, the predetermined percentage is between about 75% and about 80%. However, it should be understood that the particular predetermined percentage may be altered or adjusted according to specific embodiments. For one example, the method 400 may calculate or otherwise determine that the total current input is 13 A and the current input limit is 15 A, resulting in about an 87% usage of the current input limit. The current distribution may be spread out over the plurality of connected devices, including the domestic appliance described above.

At step 408, method 400 may include adjusting a current input (or draw) at the domestic appliance from the instantaneous current input according to the comparison of the total current input and the current input limit at the circuit breaker. In detail, method 400 may adjust one or more of the operational parameters of the domestic appliance according to the total current input to the circuit breaker. Referring again to the example above, the method 400 may determine that the total current input is greater than about 80% of the current input limit. Thus, in adjusting the current input from the instantaneous current input, the method 400 may reduce one or more of the first set of operational parameters to reduce the power consumption of the domestic appliance.

As mentioned above, the domestic appliance may be a heat pump water heater, including a sealed refrigerant system. The sealed refrigerant system may include a variable speed compressor and one or more variable speed fans, for instance. Accordingly, when the total current input is above the predetermined percentage, step 408 may include reducing an operating speed or power consumption of one or more of the compressor, the fan or fans, or additional adjustable components (e.g., auxiliary heater, water pump, etc.). Thus, the domestic appliance may be directed according to a second set of operational parameters or conditions. The second set of operational parameters may include the reduced compressor speed, the reduced fan speed, or the like. Advantageously, the domestic appliance may be adjusted to reduce current draw and subsequently power consumption to reduce strain on the circuit breaker.

According to another example, at step 406, the method 400 determines that the total current input is less than the predetermined percentage of the current input limit. For instance, the total current input at the circuit breaker (e.g., as determined by the smart current sense module) may be less than about 80% of the current input limit. Since one or more of the plurality of devices may draw current (and thus power) at selected times, the total current input at the circuit breaker may fluctuate. Thus the method 400 may determine that additional current or power is available to be provided to the domestic appliance.

Accordingly, upon determining that the total current input is less than the predetermined percentage (e.g., about 80%) of the current input limit, the method 400 may adjust one or more parameters or conditions from the first set of operational conditions (e.g., the compressor speed, the fan or fans speed, etc.). For instance, at least one of the compressor speed, the fan speed, or the like may be increased. The domestic appliance may thus draw an increased amount of current or power and thus increase a performance of the appliance.

The method 400 may include emitting a response signal to the remote terminal (e.g., the current sense module). The response signal may include the current input from the domestic appliance after adjusting the current input at the domestic appliance. For instance, after determining that the total current input is less than the predetermined percentage of the current input limit and adjusting the operational parameters of the domestic appliance accordingly, the method 400 may deliver the adjusted current draw measurement to the remote terminal. The remote terminal may temporarily store the adjusted current draw measurement (e.g., within an on board memory). The method 400 may further continue to monitor the total current input through the current sense module. By knowing the new instantaneous current draw of the domestic appliance (e.g., after adjusting from the first set of operational parameters), the method 400 may avoid accidentally overloading the circuit breaker, for instance, in the event one of the plurality of devices is activated to draw additional current therein.

The method 400 may continue to monitor the total current input at the circuit breaker (e.g., via communication with the smart current sense module). For instance, when one or more of the plurality of devices (e.g., apart from the domestic appliance) begin to draw current from the circuit breaker, the method 400 may return to step 404 or 406. Accordingly, the method 400 may compare the total current input against the current input limit. Appropriate adjustments may then be made to avoid overloading and "tripping" the circuit breaker due to excessive current input.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A domestic appliance electrically connected to a circuit breaker disposed remotely from the domestic appliance, the domestic appliance comprising:

a heat pump, the heat pump comprising a compressor;

a power inverter electrically connected with the heat pump; and a controller operably connected with the heat pump and the power inverter; the controller comprising a connection module configured to send and receive communication signals, wherein the controller is configured to perform operations, the operations comprising:

determining an instantaneous current input at the domestic appliance;

receiving, via the connection module, a signal from a remote terminal, the signal comprising a total current input at the remote terminal, the instantaneous current input being at least a portion of the total current input;

comparing the total current input against a current input limit associated with the circuit breaker after receiving the signal; and adjusting a current input at the domestic appliance from the instantaneous current input according to the comparison of the total current input and the current input limit associated with the circuit breaker.

2. The domestic appliance of claim 1, wherein the circuit break is disposed remotely from the domestic appliance in a circuit breaker panel disposed in a building; and the domestic appliance is connected to the circuit breaker together with a plurality of appliances via one or more electrical outlets provided in the building.

3. The domestic appliance of claim 2, wherein the remote terminal comprises:

a current sensing module operably coupled to each of the plurality of devices and the domestic appliance.

4. The domestic appliance of claim 1, wherein determining the instantaneous current input at the domestic appliance comprises:

sensing, at the power inverter, the instantaneous current input under a first set of operational conditions of the heat pump, the first set of operational conditions comprising a first compressor speed.

5. The domestic appliance of claim 4, wherein comparing the total current input against the current input limit associated with the circuit breaker comprises:

determining that the total current input is greater than between 75% and 80% of the current input limit.

6. The domestic appliance of claim 5, wherein adjusting the current input at the domestic appliance comprises:

adjusting the heat pump according to a second set of operational conditions, the second set of operational conditions comprising a second compressor speed, the second compressor speed being less than the first compressor speed.

7. The domestic appliance of claim 4, wherein comparing the total current input against the current input limit associated with the circuit breaker comprises:

determining that the total current input is less than between 75% and 80% of the current input limit.

8. The domestic appliance of claim 7, wherein adjusting the current input at the domestic appliance comprises:

adjusting the heat pump according to a second set of operational conditions, the second set of operational conditions comprising a second compressor speed, the second compressor speed being greater than the first compressor speed.

9. The domestic appliance of claim 1, wherein the operation further comprises:

emitting a response signal to the remote terminal, the response signal comprising the current input from the domestic appliance after adjusting the current input at the domestic appliance.

10. The domestic appliance of claim 1, wherein operations further comprise:

after receiving, via the connection module, the signal from the remote terminal, obtaining the current input limit from the circuit breaker; or after receiving, via the connection module, the signal from the remote terminal, obtaining the current input limit from one or more memories of the domestic appliance.

11. A method of managing power within a domestic appliance, the domestic appliance being electrically connected to a circuit breaker disposed remotely from the domestic appliance, the domestic appliance comprising a heat pump comprising a compressor, a power inverter electrically connected with the heat pump, and a connection module configured to send and receive communication signals, the method comprising:

determining an instantaneous current input at the domestic appliance;

receiving, via the connection module, a signal from a remote terminal, the signal comprising a total current input at the remote terminal, the instantaneous current input being at least a portion of the total current input;

comparing the total current input against a current input limit associated with the circuit breaker after receiving the signal; and adjusting a current input at the domestic appliance from the instantaneous current input according to the comparison of the total current input and the current input limit associated with the circuit breaker.

12. The method of claim 11, wherein the circuit break is disposed remotely from the domestic appliance in a circuit breaker panel disposed in a building; and the domestic appliance is connected to the circuit breaker together with a plurality of appliances via one or more electrical outlets provided in the building.

13. The method of claim 12, wherein the remote terminal comprises:

a current sensing module operably coupled to each of the plurality of devices and the domestic appliance.

14. The method of claim 11, wherein determining the instantaneous current input at the domestic appliance comprises:

sensing, at the power inverter, the instantaneous current input under a first set of operational conditions of the heat pump, the first set of operational conditions comprising a first compressor speed.

15. The method of claim 14, wherein comparing the total current input against the current input limit associated with the circuit breaker comprises:

determining that the total current input is greater than between 75% and 80% of the current input limit.

16. The method of claim 15, wherein adjusting the current input at the domestic appliance comprises:

adjusting the heat pump according to a second set of operational conditions, the second set of operational conditions comprising a second compressor speed, the second compressor speed being less than the first compressor speed.

17. The method of claim 14, wherein comparing the total current input against the current input limit associated with the circuit breaker comprises:

determining that the total current input is less than between 75% and 80% of the current input limit.

18. The method of claim 17, wherein adjusting the current input at the domestic appliance comprises:

adjusting the heat pump according to a second set of operational conditions, the second set of operational conditions comprising a second compressor speed, the second compressor speed being greater than the first compressor speed.

19. The method of claim 11, further comprising:

emitting a response signal to the remote terminal, the response signal comprising the current input from the domestic appliance after adjusting the current input at the domestic appliance.

20. The domestic appliance of claim 1, further comprising:

after receiving, via the connection module, the signal from the remote terminal, obtaining the current input limit from the circuit breaker; or after receiving, via the connection module, the signal from the remote terminal, obtaining the current input limit from one or more memories of the domestic appliance.

* * * * *